(12) United States Patent
Cassezza

(10) Patent No.: US 7,278,101 B1
(45) Date of Patent: Oct. 2, 2007

(54) CONTROLLING AUDIO VOLUME IN PROCESSOR-BASED SYSTEMS

(75) Inventor: Jason T. Cassezza, Aloha, OR (US)

(73) Assignee: Intel Corporation, Santa Clara, CA (US)

( * ) Notice: Subject to any disclaimer, the term of this patent is extended or adjusted under 35 U.S.C. 154(b) by 1117 days.

(21) Appl. No.: 09/409,330

(22) Filed: Sep. 30, 1999

(51) Int. Cl.
  *G06F 3/00* (2006.01)
  *H03G 3/00* (2006.01)

(52) U.S. Cl. .................. 715/716; 715/772; 715/740; 715/747; 715/771; 381/57; 381/104

(58) Field of Classification Search .............. 345/700, 345/716, 717, 719, 722, 727, 728, 740, 744, 345/747, 764, 771, 773, 781, 810, 832, 833, 345/835, 839, 866; 381/104, 105, 107–109, 381/57; 715/716, 740, 747, 771, 772, 700, 715/717, 719, 722, 727, 728, 744, 764, 773, 715/781, 810, 832, 833, 835, 839, 866
See application file for complete search history.

(56) References Cited

U.S. PATENT DOCUMENTS

| | | | | |
|---|---|---|---|---|
| 5,191,620 A | * | 3/1993 | Lee | ............... 345/440.1 |
| 5,265,246 A | * | 11/1993 | Li et al. | ............... 345/974 |
| 5,363,147 A | * | 11/1994 | Joseph et al. | ............... 348/738 |
| 5,559,301 A | * | 9/1996 | Bryan et al. | ............... 345/173 |
| 5,631,714 A | * | 5/1997 | Saadoun | ............... 348/738 |
| 5,640,176 A | * | 6/1997 | Mundt et al. | ............... 345/839 |
| 5,778,077 A | * | 7/1998 | Davidson | ............... 381/57 |
| 5,940,517 A | * | 8/1999 | Shinada et al. | ............... 345/35 |
| 6,067,084 A | * | 5/2000 | Fado et al. | ............... 345/708 |
| 6,069,567 A | * | 5/2000 | Zawilski | ............... 340/825.22 |
| 6,169,807 B1 | * | 1/2001 | Sansur | ............... 381/57 |
| 6,256,027 B1 | * | 7/2001 | Jeong et al. | ............... 345/788 |
| 6,584,201 B1 | * | 6/2003 | Konstantinou et al. | ............... 381/57 |

* cited by examiner

*Primary Examiner*—Sy D. Luu
(74) *Attorney, Agent, or Firm*—Trop, Pruner & Hu, P.C.

(57) ABSTRACT

A processor-based system may control the volume level of information played by said processor-based system. The system may allow the user to set one or more preset audio volume levels and the system automatically implements those levels. In one embodiment of the present invention, a remote control unit may have a microphone which records audio volume levels produced by the system and provides information which allows the system to determine whether the audio volume is within the desired ranges. If not, the audio levels may be adjusted. As a result, the audio levels may be monitored at a location proximate to the user's position with respect to the processor-based system.

12 Claims, 5 Drawing Sheets

CONTROLLING AUDIO VOLUME IN PROCESSOR-BASED SYSTEMS

BACKGROUND

This invention relates generally to processor-based systems and particularly to controlling the volume level of audio information played on such systems.

Processor-based systems receive audio information in a variety of different fashions. Some processor-based systems have television tuner cards and receive television information from broadcast, cable or satellite sources, as examples. Other systems may receive audio through Internet connections.

In general, the initial volume level of the audio information received by the processor-based system is controlled by the content provider. The content provider may set the audio volume level to suit its own interests. For example, the content provider for commercial information may raise the audio level so that the persons receiving the audio may hear the audio even if they leave the room where the processor-based system is located. In other cases, content providers may believe that most listeners will desire to have a relatively high volume level when some listeners may prefer to have a lower volume level. Similarly, some users may prefer higher volume levels than others.

To some degree, the content provider is unable to accurately assess the appropriate volume level to set for the transmitted media. One reason for this is that the content provider can not judge the hearing ability and the personal likes and dislikes of each listener. In addition, the content provider has no way to determine how far the listener sits from the processor-based system.

Thus, traditionally, the content provider has set the audio level to suit the content provider's own interests. The listener can then adjust the audio level by varying controls on the processor-based system. In some cases, a remote control unit may be used to alter audio levels with a graphical user interface to reset the audio volume levels.

Thus, there is a continuing need for better ways to allow the listener to control the volume level of audio information received in processor-based systems.

SUMMARY

In accordance with one aspect, a method of controlling volume levels in a processor-based system includes obtaining an indicia of the volume level of audio information received by the system. That indicia is compared to a preset level and the volume level is automatically adjusted towards the preset level.

Other aspects are set forth in the accompanying detailed description and claims.

DETAILED DESCRIPTION

Figure 1:
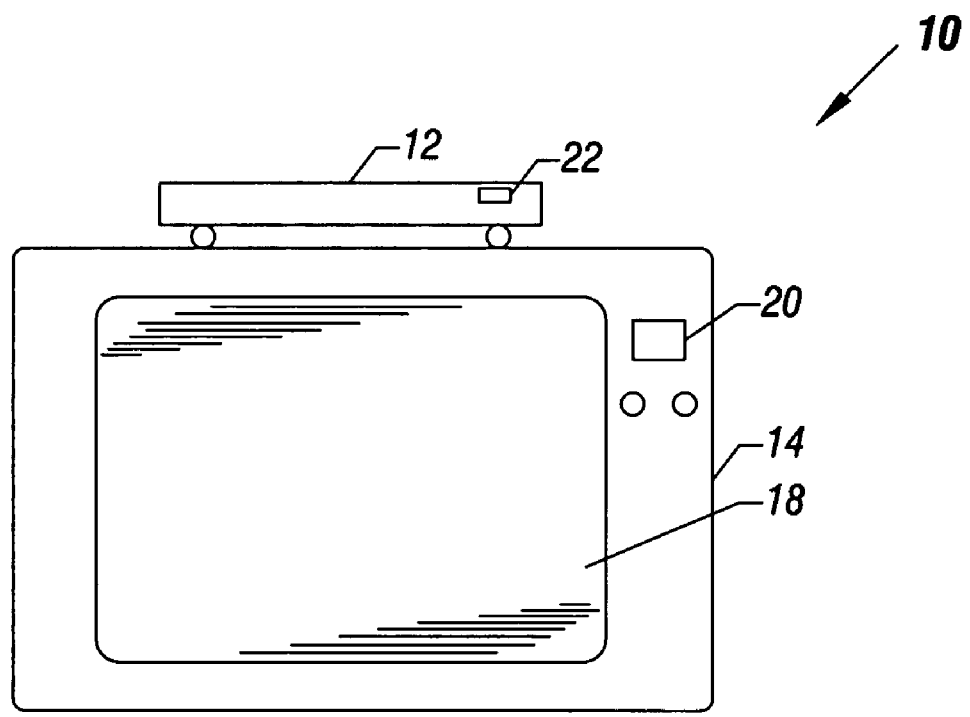
FIG. 1 is a front elevational view of one embodiment of the present invention.
Figure 1:
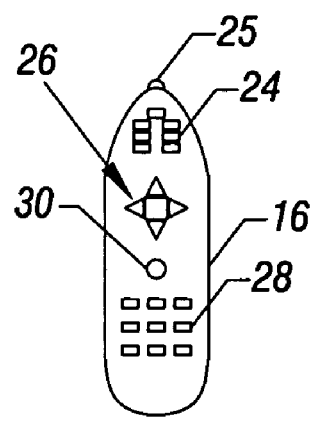

A processor-based system 10, shown in FIG. 1, may include a processor-based unit 12, a television receiver 14, and a remote control unit (RCU) 16. The RCU 16, which may be battery powered, may control the operation of the processor-based unit 12 and the television receiver 14 by way of airwave transceivers 20 and 22 on the television receiver 14 and the processor-based unit 12 respectively. For example, in one embodiment of the present invention, the RCU 16 may include a transceiver 25 which communicates with the transceivers 20 and 22 through airwave broadcasts, such as infrared, radiowave, or ultrasonic signals. In this way, the RCU 16 may remotely control each of the processor-based unit 12 and the television receiver 14.

The system 10 is illustrated as a set top computer system in accordance with one embodiment of the present invention. Conventionally, a set top computer system uses a unit 12 which sits atop a television receiver 14 and may be controlled by a remote control unit 16. However, the present invention is not in any way limited to this particular embodiment and may be applied to a variety of processor-based systems including desktop computers, laptop computers, and processor-based appliances.

The RCU 16 may include a microphone 24, cursor controls 26 and a numeric keypad 28. The numeric keypad 28 allows the user to make input commands such as channel selection commands or other input commands. The cursor controls 26 allow conventional mouse style commands. For example, the cursor controls 26 may allow the user to move through a variety of entries on an electronic programming guide, selecting a particular entry that is of interest.

Figure 2:
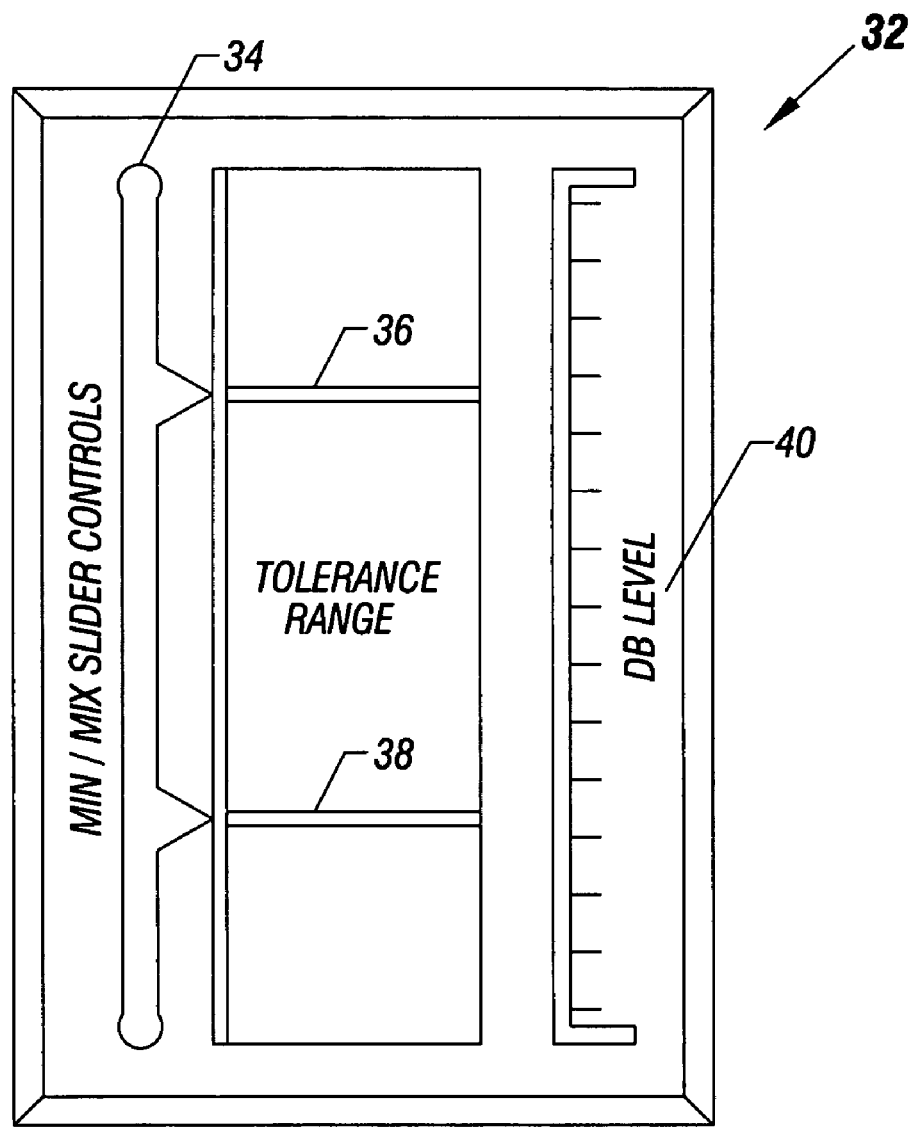
FIG. 2 is a graphical user interface which may be implemented by the system shown in FIG. 1 in one embodiment of the present invention.

A pushbutton 30 may provide a control signal which automatically causes a graphical user interface to be displayed on the screen 18 of the television receiver 14. The graphical user interface 32, shown in FIG. 2, may include a graphical slider 34. A graphical volume tolerance range indicator having a high level 36 and a low level 38 are also indicated. A graphical decibel indicator 40 may be provided as well. The user can set the high and low levels of a volume tolerance range by simply moving the high and low slider indicator 34 using mouse-like controls via the cursor controls 26. In this way, the user can reset a desired high and low volume level and the system may automatically implement those commands, in one embodiment of the present invention.

Figure 3:
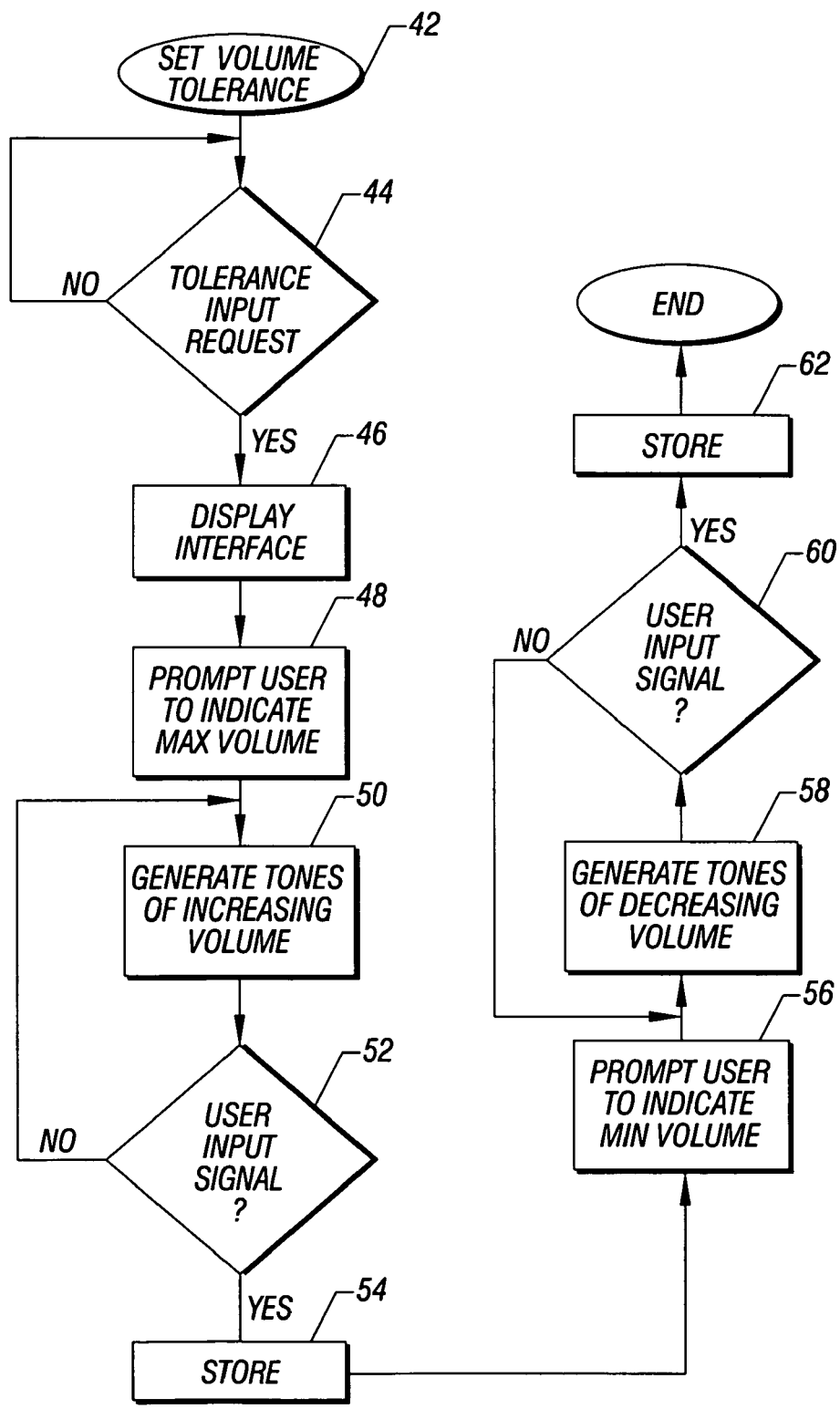
FIG. 3 is a flow chart for software for implementing one embodiment of the present invention.

Software 42 for enabling the listener to set the volume levels and the tolerance range may begin by detecting a tolerance input request as indicated in diamond 44 in FIG. 3. The input request may be the result of the user's operation of the pushbutton 30, in one embodiment of the present invention.

Upon receipt of the request, the graphical user interface 32 (FIG. 2) is displayed as indicated in block 46. The user is prompted to indicate a maximum volume. This may be done, for example, by highlighting the slider image 36. The system may then automatically generate a series of time spaced tones of increasing volume, as indicated in block 50. The user may provide an input command to indicate the volume level which the user desires not to exceed. This input command may be provided, for example, using the RCU 16, by re-operating the pushbutton 30 or by using the cursor controls 26 to operate the mouse select feature (corresponding to the left mouse button). As tones progressively become louder, the slider image 36 moves upwardly.

When the user input signal is detected, as indicated in diamond 52, the high volume level is stored as indicated in block 54. In other words, the system stores that volume level that most closely corresponds to the volume of the tone produced when the select signal is received, for example from the pushbutton 30.

Thereafter, the user may be prompted to indicate a minimum volume level as indicated in block 56. A series of time spaced tones of decreasing volume, starting at the high volume level just set, are generated as indicated in block 58. The slider image 38 moves downwardly as the tones decrease in volume. When a user select signal is detected, as indicated in diamond 60, the low volume level value is stored, as indicated in block 62. The recorded low volume level is the one that most closely corresponds to the volume of the tone produced when a select signal is received.

Figure 4:
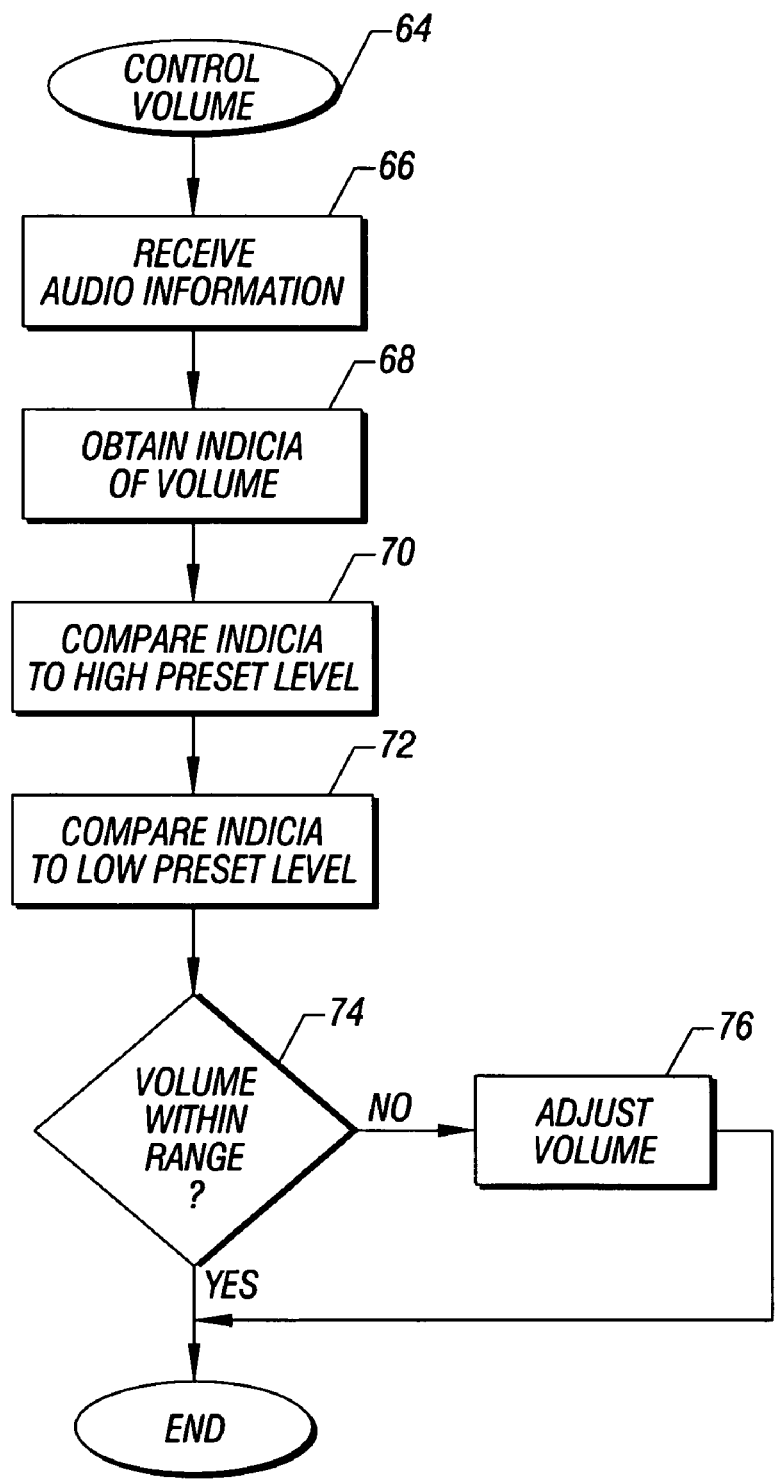
FIG. 4 is a flow chart for implementing software in accordance with another aspect of one embodiment of the present invention.

Referring next to FIG. 4, software 64 for controlling the volume level of audio received by the processor-based system begins by receiving audio information as indicated in block 66. The audio information may be received from a variety of sources including the Internet, television broadcasts over the airwaves, satellite or cable and audio broadcasts over airwaves or by satellite, as examples.

The system then obtains an indicia of the volume level (block 68). This indicia can be obtained in a number of different ways. In one embodiment of the present invention, the RCU 16 includes a microphone 24. The microphone 24 may receive the audio information generated by the television receiver 14 or the processor-based unit 12. Since the RCU 16 is usually maintained in close association with the user, the RCU 16 microphone 24 provides a good indicia of how loud the information is when it reaches the user. This loudness information may then be retransmitted back to the processor-based unit 12 for operation with the software 64.

Alternatively, indicia may be obtained from the received audio information itself. This information may then be analyzed within the processor-based unit 12.

The indicia is then compared to the high volume level previously set by the user, as indicated in block 70. Thereafter, the indicia is compared to the preset low volume level, as indicated in block 72. A check at diamond 74 determines whether the currently detected volume level is within the user's tolerance range. If so, the flow ends. Otherwise the volume is adjusted.

For example, if the volume is below the user's tolerance range, the volume may be automatically increased in decibels and conversely if the volume is above the user's tolerance range the volume may be automatically decreased. In other words, the volume level is automatically adjusted toward a pre-set high or low level. In some embodiments of the present invention, instead of having a fixed, set limit, the volume may be progressively increased or decreased around the lower and upper levels, respectively.

That is, as the volume approaches the user's preset volume level, it may be progressively decreased at the high level and increased at the low level. As a result, the user may not notice an abrupt volume change at volume levels near the high and low levels. As the volume attempts to exceed the pre-set level, the volume may be damped or reduced toward the pre-set high level. Similarly, the volume may be progressively increased toward the low volume level when the volume is below the low level.

Figure 5:
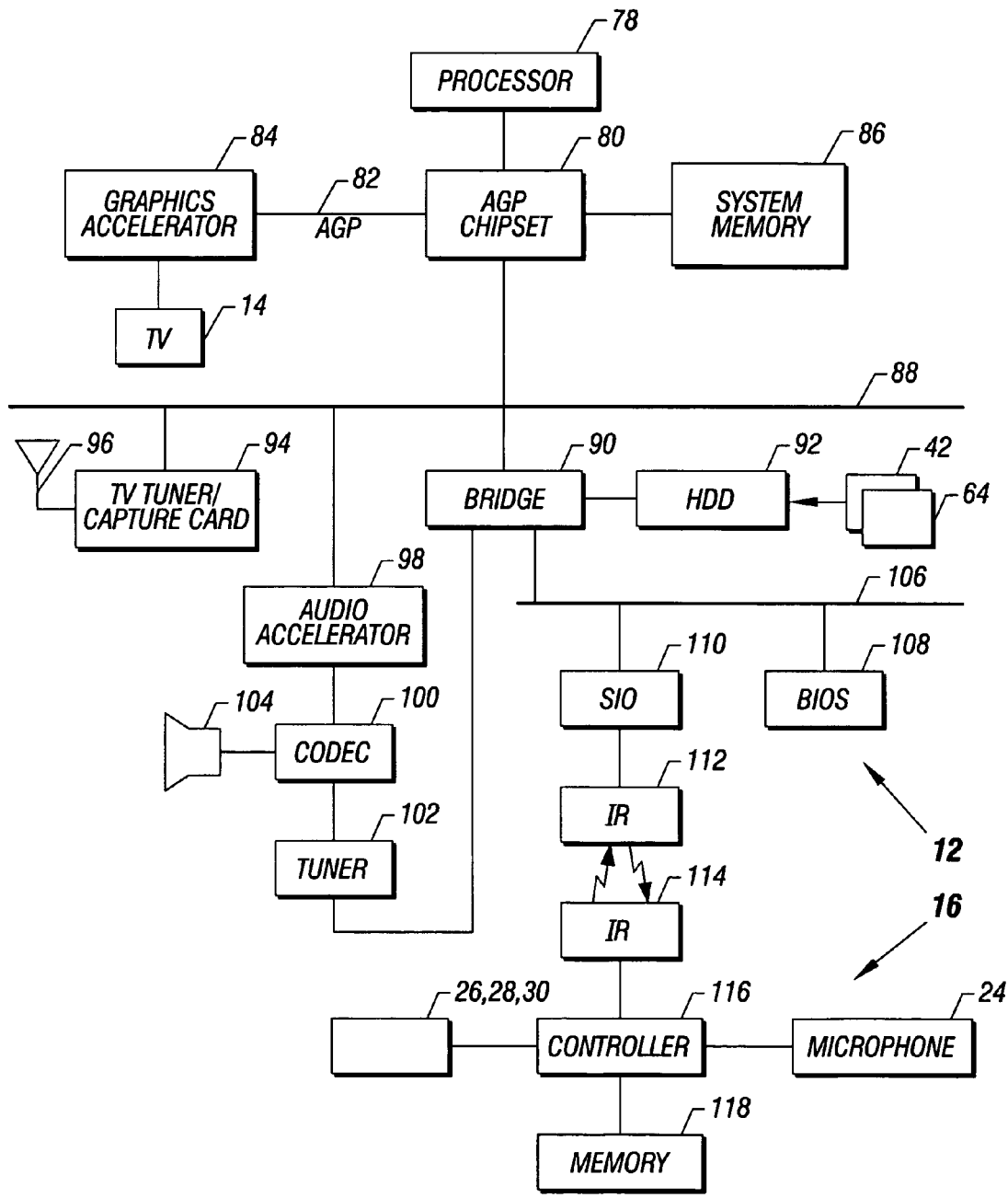
FIG. 5 is a block diagram for implementing one embodiment of the system shown in FIG. 1.

Referring next to FIG. 5, a hardware implementation for one embodiment of the invention includes a processor 78. In one embodiment, the processor may be coupled to an accelerated graphics port (AGP) (see Accelerated Graphic Port Interface Specification, Rev. 1.0, published Jul. 31, 1996 by Intel Corporation, Santa Clara, Calif.) chipset 80 for implementing an accelerated graphics port embodiment. The chipset 80 communicates with the AGP port 82 and the graphics accelerator 84. The television 14 may be coupled to the video output of the graphics accelerator 84. The chipset 80 also accommodates the system memory 86.

The chipset 80 is also coupled to a bus 88. The bus 88 couples to a television tuner/capture card 94 which is coupled to an antenna 96 or other video input port such as a cable input port, a satellite receiver/antenna or the like. The television tuner/capture card 94 selects a desired television and also performs a video capture function. One suitable video capture card is the ISVR-III video capture card available from Intel Corporation.

The bus 88 is also coupled to a bridge 90 which may couple a storage device such as a hard disk drive 92 or a flash memory. The drive 92 may store the software 42 and 64. The bus 80 may also be coupled to an audio accelerator 98. The audio accelerator 98 is in turn coupled to a coder/decoder (codec) 100. The codec 100 may be coupled to a speaker 104 which may be integral with or coupled to the processor-based unit 12. The sounds generated by the processor 78 are sent through the audio accelerator 98 and the codec 100 to the speaker 104. The bridge 90 may also be coupled to the codec 100 through a tuner 102. The codec 100 may be an AC'97 codec compliant with the Codec AC'97 Specification available from Intel Corporation (www.developer.intel.com/pc-supp/platform/ac97).

The bridge 90 may also be coupled to another bus 106. The bus 106 may in turn be coupled to a serial input/output (SIO) device 110. The device 110 may be coupled to an infrared interface 112. The infrared interface may be an Infrared Data Association (IrDA) specification (http://www.irda.org) compliant infrared interface. Alternatively, the interface 112 may be implemented by other airwave communication techniques as well. The interface 112 may communicate via infrared signals with an infrared interface 114 on the RCU 16.

The interface 114 on the RCU 16 communicates with a controller 116 which may be a processor such as a digital signal processor. The controller 116 communicates with the keypad 28, the button 30, and the controls 26 on the RCU 16 as well as with the memory 118. The memory 118 may be conveniently implemented by a flash memory. Alternatively, the microphone that picks up sound levels produced by the system 10 may be in the unit 12 or any other component of the system 10.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method of controlling volume levels in a processor-based system comprising:

in response to a user input, automatically generating over time, after the cessation of said user input, a series of sounds of progressively changing volume on a processor-based system;

receiving a user selection on a remote control; and using said user selection to control the volume of sound generated by said processor-based system by determining the volume of the sound of said series of sounds of progressively changing volume when the second user selection was received.

2. The method of claim 1 including correlating the time period when the user selection is received to the volume of the sound being generated at the time the user selection was received and recording that volume level as a preset sound level.

3. The method of claim 2 including comparing an audio volume level produced by said system to the preset sound level.

4. The method of claim 1 wherein automatically generating includes generating sounds of increasing volume.

5. An article comprising a medium storing instructions that, if executed, enable a processor-based system to:
   in response to a user input, automatically generate over time, after the cessation of said user input, a series of sounds of progressively changing volume on a processor-based system;
   receive a user selection on a remote control; and
   use said user selection to control the volume of sound generated by said processor-based system by determining the volume of the sound of said series of sounds of progressively changing volume when the user selection was received.

6. The article of claim 5 further storing instructions that, if executed, enable the processor-based system to correlate the time period when the user selection was received to the volume of the sound being generated at the time the user selection was received and record the volume level as a preset sound level.

7. The article of claim 6 further storing instructions that, if executed, enable the processor-based system to compare an audio volume level produced by said system to the preset sound level.

8. The article of claim 5 further storing instructions that, if executed, enable the processor-based system to automatically generate sounds of increasing volume.

9. A system comprising:
   a processor;
   a storage coupled to said processor;
   a sound generating circuit coupled to said processor;
   a remote control unit to receive user inputs and to receive sound generated by said sound generating circuit and to provide information about a user selected sound to said processor; and
   software stored on said storage to, in response to a user input, automatically generate over time, after the cessation of said user input, a series of sounds of progressively changing volume on a processor-based system, receive a user selection on a remote control, and use said user selection to control the volume of sound generated by said processor-based system by determining the volume of the sound of said series of sounds of progressively changing volume when the user selection was received.

10. The system of claim 9, said software to correlate the time period when a user selection is received to a volume of the sound being generated at the time the user selection was received and recording that volume level as a preset sound level.

11. The system of claim 10, said software to compare an audio volume level produced by said system to the preset sound level.

12. The system of claim 9 wherein said circuit to produce sounds of increasing volume.

* * * * *